United States Patent [19]
Gilson

[11] Patent Number: 5,430,734
[45] Date of Patent: Jul. 4, 1995

[54] FAULT-TOLERANT WAFERSCALE INTEGRATED CIRCUIT DEVICE AND METHOD

[75] Inventor: Kent L. Gilson, Salt Lake City, Utah

[73] Assignee: Metalithic Systems, Inc., Sandy, Utah

[21] Appl. No.: 17,519

[22] Filed: Feb. 12, 1993

[51] Int. Cl.$^6$ ............................................. H04B 17/00
[52] U.S. Cl. .................... 371/22.2; 371/221; 371/16.1; 395/800
[58] Field of Search .................. 371/22.2, 16.5, 29.1, 371/22.1, 16.1; 364/489, 716; 307/465, 465.1; 395/800

[56] References Cited

U.S. PATENT DOCUMENTS

| | | | |
|---|---|---|---|
| 4,140,967 | 2/1979 | Balasubramanian et al. | 324/73 R |
| 4,380,811 | 4/1983 | Götze et al. | 307/465 |
| 4,418,410 | 11/1983 | Goetze et al. | 371/57 |
| 4,511,812 | 4/1985 | Satake | 307/465 |
| 4,811,345 | 3/1989 | Johnson | 371/16.1 |
| 4,857,773 | 8/1989 | Tahata et al. | 307/465 |
| 4,870,302 | 9/1989 | Freeman | 307/465 |
| 4,937,475 | 6/1990 | Rhodes et al. | 307/465 |
| 5,109,353 | 4/1992 | Sample et al. | 307/465 |
| 5,128,559 | 7/1992 | Steele | 307/465 |
| 5,212,652 | 5/1993 | Agrawal et al. | 364/716 |
| 5,315,535 | 5/1994 | Kikuchi et al. | 364/489 |
| 5,321,322 | 6/1994 | Verheyen et al. | 307/465.1 |
| 5,341,092 | 8/1994 | El-Ayat et al. | 371/22.2 |

OTHER PUBLICATIONS

Babb, Tessier and Agarwal, Virtual Wires: Overcoming Pin Limitations in FPGA-based Logic Emulators Jan. 26, 1993 pp. 1-15.

Primary Examiner—Emanuel T. Voeltz
Assistant Examiner—Hal D. Wachsman
Attorney, Agent, or Firm—Harry M. Weiss

[57] ABSTRACT

A fault tolerant IC device is made from a wafer of field programmable gate arrays (FGPA's). Each FGPA is first tested and a wafer map of defective FGPA locations is recorded. A hardware description defines desired circuit operation either via a schematic or a functional description such as a equation or a formula. The hardware description is compiled into a list of required wafer resources and a partitioner allocates this list among the resources available in the FGPA's on the wafer. A automatic router then interconnects to implement the circuit function using the wafer map to avoid all defective FGPA locations. A bit-stream generator then generates the configuration data to program each FGPA to perform it's desired function. The resulting wafer-scale circuit is wafer fault tolerant since the programming avoids and non-functional portions of the wafer. Possible embodiments include XILINX FGPAs, custom wafers with FGPAs and special circuitry and wafers having FGPAs programmed to form RISC processors.

16 Claims, 4 Drawing Sheets

FAULT-TOLERANT WAFERSCALE INTEGRATED CIRCUIT DEVICE AND METHOD

RELATED PATENTS

This patent application is related to my U.S. Pat. No. 5,361,373 entitled "Integrated Circuit Computing Device Comprising a Dynamically Configurable Gate Array Having a Microporocessor and Reconfigurable Instruction Execution Means and Method Therefor", dated Nov. 11, 1994, which is incorporated herein by reference.

BACKGROUND OF THE INVENTION

1. Field of the Invention

This invention generally relates to integrated circuit devices, and, more specifically, relates to a fault-tolerant integrated circuit device comprising a wafer of dynamically configurable gate arrays. This device provides fault-tolerance with respect to manufacturing defects by mapping all defective gate arrays and defective portions of each gate array on the wafer. This mapping of defects occurs when the wafer is initially tested after fabrication, and the mapping information is used to program the wafer with the desired functions without using any of the defective portions of the wafer.

2. Description of the Related Art

Programmable logic devices are well-known in the electronics art, and have progressed from simple AND-OR arrays to very complex Field Programmable Gate Arrays (FPGAs), which have a large number of input-/output (I/O) blocks, programable logic blocks and programmable routing resources to interconnect the logic blocks to each other and to the I/O blocks. Many uses for these FPGAs have been found, with most being used to implement a high number of combinatorial logic functions, which results in lower part count, lower power dissipation, higher speed and greater system flexibility than if discrete components were used.

In recent years FPGAs based on Random Access Memory (RAM) were introduced by several manufacturers, including XILINX. The basic configuration of the XILINX FPGA is described in U.S. Pat. No. 4,870,302 to Freeman, which is assigned to XILINX, and is incorporated herein by reference. In addition, the technical features of XILINX FPGAs are described in XILINX, *The Programmable Gate Array Data Book*, (1992). The XILINX RAM-based FPGA has multiple I/O blocks, logic blocks and routing resources. The routing resources are used to interconnect the logic blocks to each other and to the I/O blocks, and to connect the I/O blocks to the I/O pads of the FPGA. The programming of the FPGA is accomplished by loading Configuration Data into the Configuration Memory Array of the FPGA. Since the XILINX FPGA is RAM-based, when power is first applied to the FPGA it has not yet been configured. Once the Configuration Data has been loaded into the Configuration Memory Array, the FPGA is ready for operation. The process of designing a circuit for a XILINX FPGA is described in XILINX, *User Guide and Tutorials*, (1991).

For a brief history of advances in integrated circuit (IC) technology, see John L. Hennessy and David A. Patterson, *Computer Architecture: A Quantitative Approach*, 53–62, (1990). With each advancement in IC technology, performance has typically increased by one to two orders of magnitude. The driving force behind IC performance includes three basic factors: 1) gate propagation delay, or time it takes a transistor to turn on and off; 2) signal propagation delay, or time it takes a signal to propagate from the output of one gate to the input of another; and 3) level of integration or number of gates that are incorporated onto a working die.

The first two factors, gate and signal propagation delay, are determined by the minimum feature size of the processing technology. As the minimum feature size is reduced, the effects of both of these factors are reduced, resulting in an improvement in overall speed and performance. The third factor, integration density, is determined primarily by the clean room environment and the processing technology. As the level of integration increases, the circuit will become more powerful, since more logical resources can be fabricated on-chip. This higher level of integration eliminates the long propagation delays that occur between two chips, increasing system speed and performance.

The obvious solution to increasing the speed of the IC would be to increase the overall size of the die and decrease the size of each gate or processing element. However, as the die size increases, the number of devices on a semiconductor wafer decreases and the yield (percentage of acceptable working die on one wafer) drops exponentially. This drop is expected since the number of defects per given area remains constant, while the size of the die increases, which increases the likelihood that a defect will occur in the die. Yield is determined by two primary factors, the particle count in parts per billion (PPB) of the clean room, and the die size of the chip. If an error, due to dust or inconsistencies in the crystal lattice, occurs on a specific chip on the wafer, then the chip becomes useless. Since yield drops as chip size increases, chips are typically designed with only the minimum circuits required to make them work, and if any part of the chip is non-functioning then the entire chip is useless. As the chip size increases, the chip count on a wafer decreases. As the chip count on a wafer decreases, the probability of chip failure increases. Semiconductor devices with relatively small die size provide a much higher number of devices per wafer and have a much higher yield than for devices that have larger die sizes. Thus, practical limitations on die size directly conflict with the goal of increasing the complexity and functionality of FPGAs, which inherently pushes the die size for FPGAs to increase.

A powerful example of the yield decrease that occurs from increasing die size follows. On a six inch wafer, 23.2 chips that are one cm per side (which are smaller than the 80486 microprocessor developed by Intel) can be built with a typical yield of 3.6%. This yield means that two wafers at a cost of $550 each would be required to get one usable chip. If the die size of the chip were decreased, more chips could be fabricated on a single wafer, and the probability of chip failure would decrease.

Defects in the wafer would have a less dramatic impact if extra or spare circuitry were included on the die to allow bypassing the defect. The manufacturer of the wafer would then be able to determine defects on the die and replace nonfunctional circuitry with the spare circuitry. This technique makes the chip fault-tolerant, and has been implemented by manufacturers to some extent. For example, U.S. Pat. No. 4,937,475 to Rhodes et al. discloses an integrated circuit chip with multiple logic blocks interconnected by a series of horizontal and vertical conductors. The vertical conductors are electrically isolated from the crossing horizontal conductors, and have a laser diffusible region at each intersection such that a laser beam can cause the region to conduct thereby connecting the vertical conductor with the crossing horizontal conductor. In addition the laser beam is used to sever the conductors in certain places. In this manner the laser beam can custom-configure the chip as desired by making some connections and breaking others, which allows the defective portions of the chip to be bypassed.

The success of fault-tolerance through redundant or spare circuitry has been limited, however, because the granularity of the spare circuitry in current architectures is unworkable. For example, in the case of a microprocessor chip, to duplicate functional units (such as the Arithmetic Logic Unit (ALU), registers, etc.), the designer would have to increase the area of the die by at least twice. If nothing was wrong with the primary units, then half of the die would be wasted on unused spares. In addition, increasing the size of the die to accommodate spares causes the yield to drop even further, since the same yield statistics that apply to an entire chip also apply to the spares.

A solution to this problem is to provide a general-purpose functional block architecture similar to the XILINX dynamically configurable FPGAs referenced above. If each functional block on a chip is identical, faults on the chip can be easily bypassed by routing the circuitry around any functional blocks rendered non-functional by defects. If the granularity of the functional blocks is sufficiently small, the number of defective functional blocks will be small compared to the number of operable functional blocks. Thus an FPGA which has functional blocks of sufficiently small granularity will not be significantly impacted by defects, making the FPGA fault-tolerant. A wafer of such FPGAs would allow bypassing of all defects, rendering the entire wafer fault-tolerant. In this manner one large circuit could be made using the entire area of a wafer. This process, called waferscale integration, would allow circuits to be developed and fabricated that are fault-tolerant and, hence, not susceptible to the traditional drop in yield associated with increasing the size of the die.

Therefore, there existed a need to provide a waferscale integrated circuit device and method which provides a high level of complexity and functionality while still maintaining high production yields through a programmable functional block architecture and a fault-tolerance scheme that utilizes the functional blocks of the device that are functional after fabrication and does not utilize the functional blocks of the device that are non-functional after fabrication. These functional blocks must be of sufficiently small granularity to assure a high yield of functional blocks with respect to manufacturing defects.

SUMMARY OF THE INVENTION

It is an object of this invention to provide a fault-tolerant integrated circuit device and method comprising a wafer of configurable gate arrays which are interconnected such that non-functioning gate arrays on the wafer are not used.

It is another object of this invention to provide a fault-tolerant integrated circuit device and method comprising a wafer of XILINX FPGAs which are interconnected such that non-functioning FPGAs on the wafer are not used.

It is a further object of this invention to provide a fault-tolerant integrated circuit computing device and method comprising a wafer of dynamically configurable gate arrays programmed to implement a microprocessor and a reconfigurable instruction execution unit which can be dynamically configured to implement a variety of high level functions in hardware, thereby drastically improving system speed.

According to the first embodiment of the present invention, a fault-tolerant integrated circuit device is provided. This device is a wafer of FPGAs such as the RAM-based XC3020 FPGA by XILINX. Once fabrication of the wafer is complete, each FPGA on the wafer is functionally tested. All FPGAs rendered non-functional due to defects are mapped as non-functional, and also any portions of FPGAs that are non-functional without rendering the entire FPGA non-functional are likewise mapped. This defect map is used to assure the defective portions of the wafer are not used. The I/O pads of the gate arrays on the wafer are then interconnected with bonding wires. The interconnection scheme with the bonding wires may interconnect all FPGAs on the wafer, but nominally the FPGAs that are completely non-functional are bypassed and not connected to the functional FPGAs.

The desired function of the wafer may be represented in a number of different forms. A high level Functional Description could include either computer code comprising a list of instructions of the desired function, a list of equations relating the outputs of the circuit to functions of the inputs and other outputs, a list of formulae, or other high-level functional descriptions. This high level Functional Description is then compiled using special purpose software into a Hardware Description of the desired circuit functions. In the alternative, the desired Hardware Description could be entered directly via a schematic diagram, or could also be represented using a Virtual Hardware Description Language (VHDL), which is well-known in the art. The Hardware Description is a general description of the desired circuit functions that is independent of the specific implementation of the circuitry on the wafer.

Another special software program compiles the Hardware Description of the desired wafer function into a list of required XILINX resources, which comprise a subset of the available resources on the wafer, which comprise the I/O blocks, logic blocks and routing resources within the FPGAs on the wafer. This is possible due to the functional block architecture of the XILINX FPGAs, which provides a finite set of circuit functions and configurations that each functional block can provide. A Partitioner then partitions the resultant set of required XILINX resources among the many FPGAs on the wafer using the map of defects to assure that only functional portions of the wafer are used. This partitioning defines the function of each individual FPGA on the wafer. A Mapper then uses the defect map to determine the interconnects required within each FPGA without using any defective portions of the FPGA, and creates the Configuration Data for each individual FPGA.

When the wafer is initially powered up, it is then configured by loading the appropriate Configuration Data into the Configuration Memory Array of each FPGA. Since the XILINX FPGAs are RAM-based, they can be dynamically reconfigured to implement any number of desired functions. But the configuration data for each new configuration of the wafer must go through the same partitioning and mapping process to assure that no defective portions of the wafer are used.

In the second embodiment of the present invention, a wafer of XILINX FPGAs is not used, but the device of the present invention is implemented using a custom wafer which nominally has an array of RAM-based, dynamically configurable FPGAs, along with other circuitry specially suited to specific applications.

In the third embodiment of the present invention, one or more of the FPGAs on the wafer have a microprocessor and reconfigurable instruction execution unit as described in my related patent application. The number of logic blocks and routing resources must allow for implementing a simple microprocessor such as a Reduced Instruction Set Computer (RISC). This RISC Processor is coupled to a Reconfigurable Instruction Execution Unit that can be reconfigured to implement a variety of very complex operations in hardware. This is accomplished by dynamically reprogramming the FPGA such that the Reconfigurable Instruction Execution Unit is reconfigured to perform the appropriate operation in hardware while most of the remaining functions within the FPGA remain unaltered. This configuration allows the reconfigurable instruction execution unit to implement very complex operations relatively quickly in hardware rather than using time-consuming software routines, thereby greatly improving system speed. If the wafer has 100 functional FPGAs which are all interconnected with each programmed with a RISC Processor and Reconfigurable Instruction Execution Unit, this array of computing devices could share tasks and operate in parallel, which would greatly improve the computational speed for a given task. The wafer would then be a computer with 100 different computing devices all interconnected on the same wafer, allowing for a high level of parallel processing and, hence, a very high level of performance and computing speed not available with small computers of the prior art.

The foregoing and other objects, features and advantages will be apparent from the following description of the preferred embodiment of the invention as illustrated in the accompanying drawings.

DESCRIPTION OF THE PREFERRED EMBODIMENTS

An understanding of the basic design and programming process for XILINX FPGAs will aid the reader in understanding the device of the present invention. A reference which explains in detail the design flow and methodology for XILINX FPGAs is XILINX, *User Guide and Tutorials*, (1991).

Figure 1:
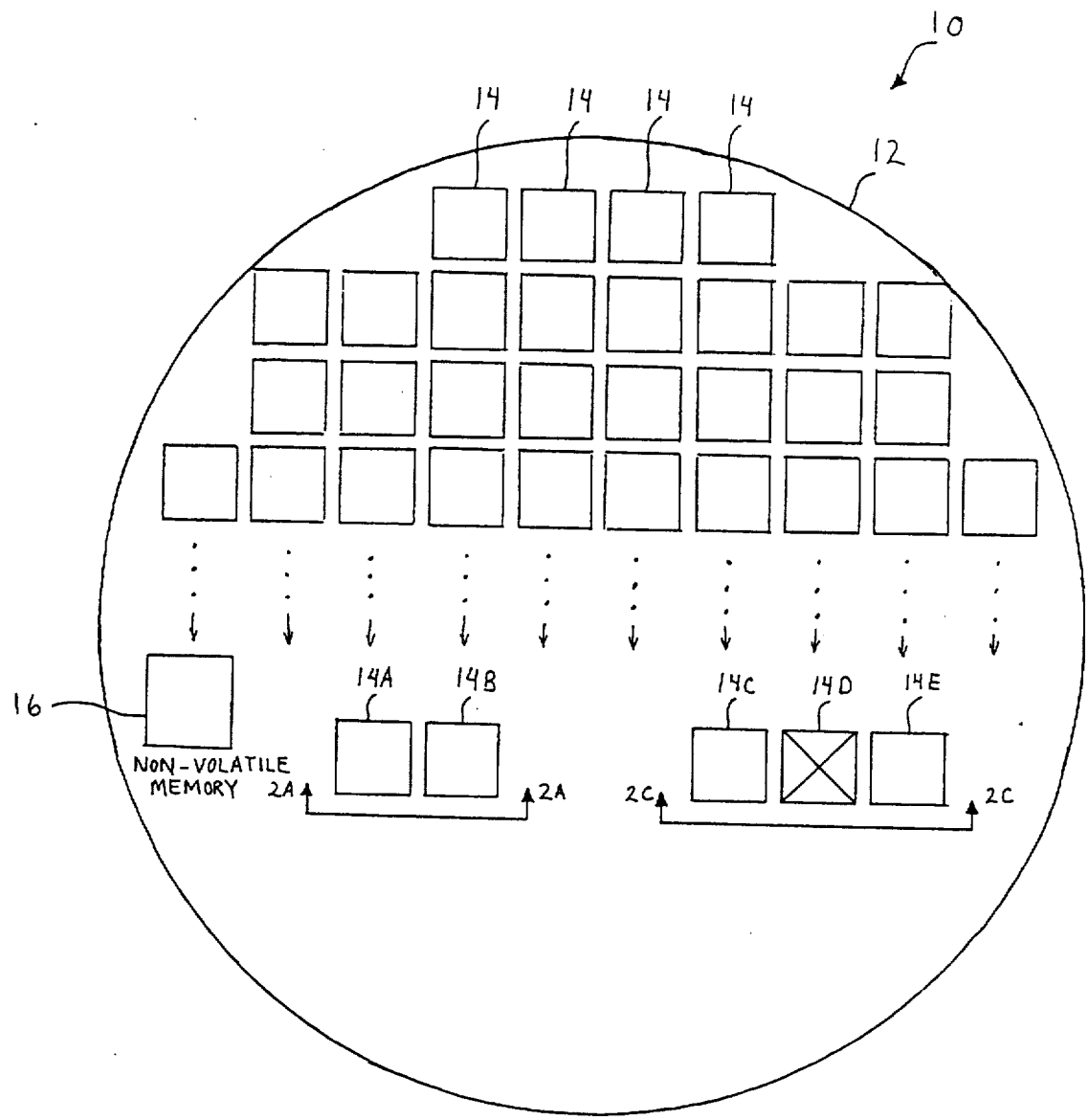
FIG. 1 is a top view of the integrated circuit device of the present invention comprising a wafer that has many individual Field Programmable Gate Arrays (FPGAs).
Figure 3:
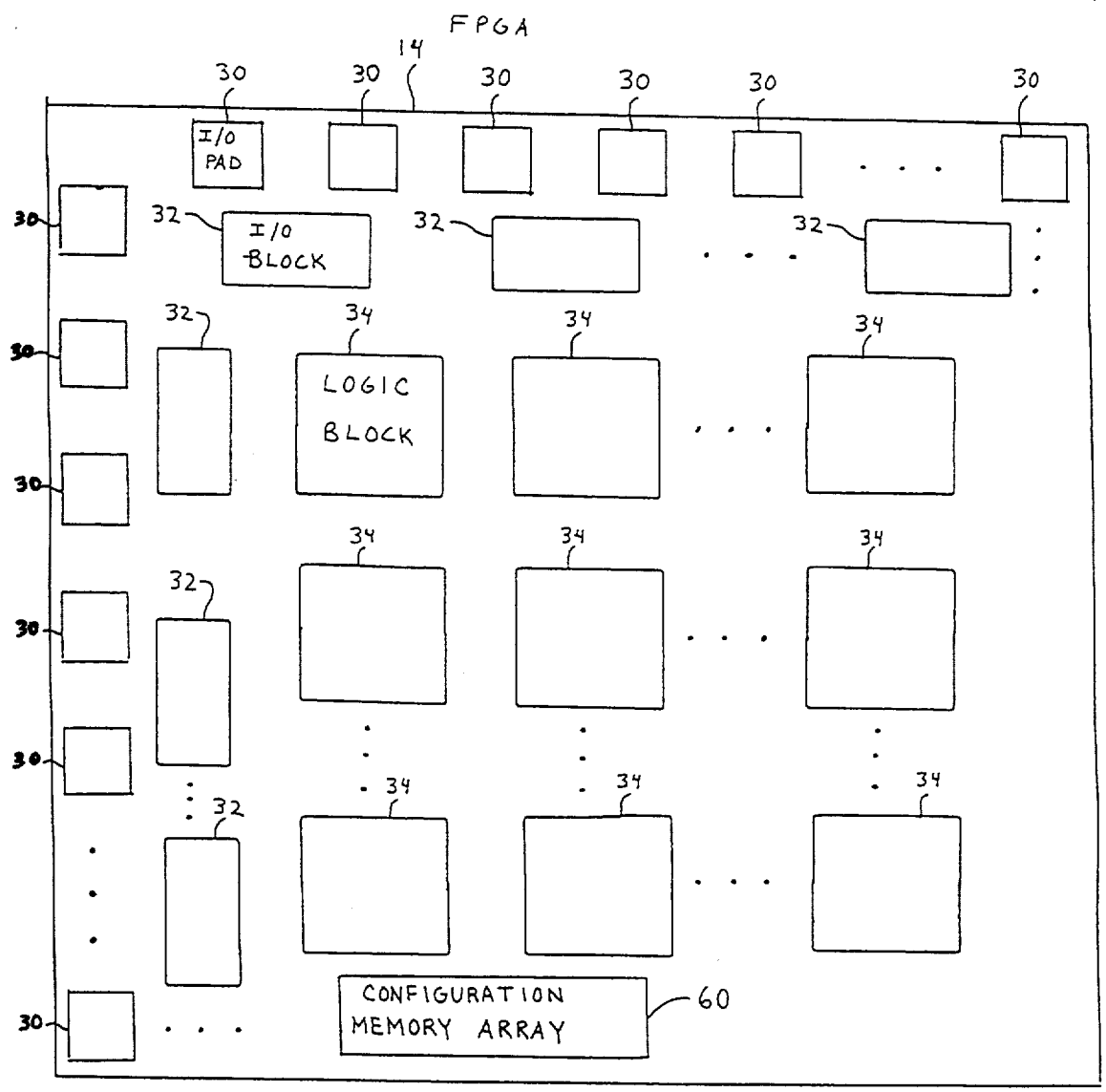
FIG. 3 is a block diagram of one of the many FPGAs fabricated on the wafer shown in FIG. 1.

The fault-tolerant integrated circuit device 10 of the present invention is shown in FIG. 1. This device 10 comprises a wafer 12 which has many Field Programmable Gate Arrays (FPGAs) 14 fabricated thereon. While only the top half of wafer 12 is shown fully populated with FPGAs 14, this is done for illustrative purposes and it is evident that the entire wafer 12 is used in reality. The detailed configuration of each individual FPGA 14 is shown in FIG. 3, and includes I/O pads 30, I/O Blocks 32, Logic Blocks 34, Routing Resources (not shown) and a Configuration Memory Array 60. The I/O Pads 30 are contacts on the FPGA 14 which connect the FPGA 14 to circuitry external to FPGA 14. The I/O Blocks 32 are programmable blocks that can be configured to provide input or output signals to the I/O Pads 30 of FPGA 14, and can also be programmed with such features as signal feedback into FPGA 14 or registered inputs and outputs.

The Logic Blocks 34 contain circuitry that can be programmed to perform a myriad of different functions. The specific configuration of the Logic Blocks 34 is not critical, provided the Logic Blocks 34 provide the required minimum level of functionality to implement the desired circuitry. The Routing Resources (not shown) are a large number of conductors that cross at numerous points within FPGA 14 controlled by programmable pass transistors, and, once properly programmed, the pass transistors and Routing Resources provide the majority of the signal paths between the I/O Pads 30, the I/O Blocks 32, and the Logic Blocks 34. These programmable pass transistors are programmed by writing Configuration Data to Configuration Memory Array 60. The XILINX XC3020 FPGA can be programmed by writing Configuration Data to Configuration Memory Array 60 in either parallel or serial modes. In either case, the Configuration Memory Array 60 is filled with Configuration Data from an external source, which programs the FPGA 14 to perform the desired functions.

The FPGA 14 is thus a general purpose, programmable device. The I/O Blocks 32 and the Logic Blocks 34 can each be programmed to perform specific functions, and the Routing Resources can be programmed to interconnect the I/O Blocks 32 with the I/O Pads 30 and the Logic Blocks 34 to achieve the desired overall function of the FPGA 14. The result of this flexible architecture is a user-configurable FPGA capable of a very high level of performance.

Figure 2A:
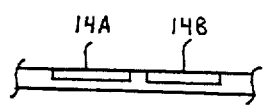
FIG. 2A is a cross-sectional view of the wafer in FIG. 1 taken along the line 2A—2A before the bonding wires are placed to interconnect the FPGAs.
Figure 2C:
FIG. 2C is a cross-sectional view of the wafer of FIG. 1 taken along the line 2C—2C after the bonding wires are placed to interconnect the FPGAs in a manner to avoid using a non-functional FPGA.
Figure 2B:
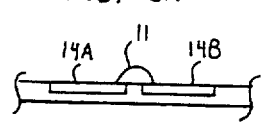
FIG. 2B is a cross-sectional view of the wafer of FIG. 1 taken along the line 2A—2A after the bonding wires are placed to interconnect the FPGAs.

FIGS. 2A-2C illustrate the interconnection of FPGAs 14 on wafer 12 using bonding wires. FIG. 2A shows a cross-sectional view of two FPGAs 14A and 14B prior to interconnecting these with bonding wires. FIG. 2B shows these same FPGAs once bonding wires 11 are in place to connect some of the I/O pads of FPGA 14A to some of the I/O pads on FPGA 14B. FIG. 2C illustrates how a non-functional FPGA 14D can be bypassed by connecting FPGA 14C directly to FPGA 14E using bonding wires 11.

Figure 5:
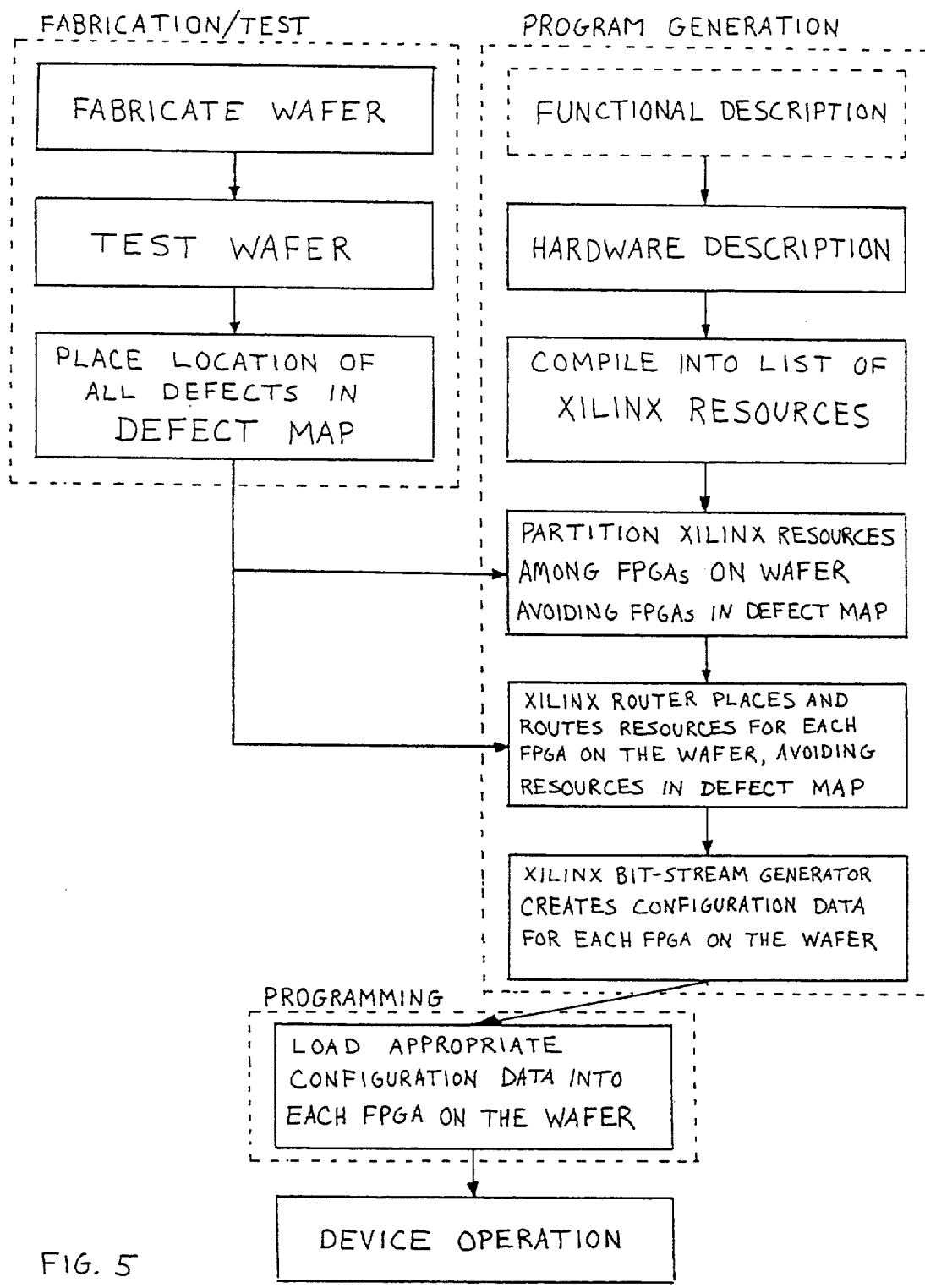
FIG. 5 is a flow chart of the Fabrication/Test, Program Generation, and Programming processes used to prepare the device 10 of FIG. 1 for operation.

FIG. 5 shows the flow chart for preparing the device 10 of the present invention for operation, and the first portion of interest is the Fabrication/Test process. The first step is to fabricate the wafer. After fabrication is complete, each FPGA 14 on wafer 12 is functionally tested, and a Defect Map is created. This Defect Map can be stored in a special, non-volatile memory portion 16 of the wafer 12 as shown in FIG. 1, or can also be stored on a floppy diskette. The Defect Map contains two different types of data: 1) Location of FPGAs which are completely non-functional, and 2) Location of non-functional portions of partially functional FPGAs. This completes the Fabrication/Test portion of the process for generating the device 10 as shown in FIG. 5.

The person desiring to use the device 10 must develop a program for configuring the device 10 appropriately to accomplish the desired task. This portion of the design process is represented in the Program Generation process in FIG. 5. The first step is to create a Hardware Description of the desired circuit functions. This can be done directly using a schematic editor or a Virtual Hardware Description Language (VHDL) to directly represent the desired circuit functions. In the alternative, a Functional Description in the form of high-level computer code, equations or formulae could be compiled into an equivalent Hardware Description. Since the Functional Description can be precluded by using a direct Hardware Description, the Functional Description block in FIG. 5 is represented using dashed lines to show that this step is optional.

The Hardware Description is used as input to a software design tool which takes the Hardware Description and compiles it into a list of required XILINX resources to accomplish the desired function. The available XILINX resources depend on the specific number and type of functional blocks provided on the particular XILINX FPGA being used, and the number of FPGAs 14 on the wafer 12. A Partitioner then takes the list of required XILINX resources and allocates the list of required XILINX resources among the individual FPGAs 14 on the wafer 12, being sure not to allocate any required resources to any FPGAs 14 that are substantially non-functional according to the Defect Map. A standard XILINX Router then places and routes the required resources for each individual FPGA, avoiding non-functional portions according to the Defect Map. A standard XILINX Bit-stream Generator is then used to generate Configuration Data for configuring each FPGA appropriately. This step is repeated until Configuration Data for each FPGA 14 on wafer 12 is created. This completes the Program Generation Process shown in FIG. 5.

Once the Configuration Data for the entire wafer 12 is created, the Programming process shown in FIG. 5 loads the Configuration Data into the appropriate FPGAs 14, and the device 10 is ready for operation. Since the XILINX FPGAs are RAM-based, it is possible to dynamically reconfigure one or all of the FPGAs on wafer 12 to change the function of device 10 as needed. However, all Configuration Data for wafer 12 must be generated using the Program Generation process of FIG. 5 to assure the defects on wafer 12 are bypassed.

Since the Configuration Data for each FPGA 14 depends on the Defect Map, which is specific to a given wafer, the Configuration Data for one wafer would not work with a second wafer, since it may attempt to use resources on the second wafer that are non-functional. Thus the Configuration Data is unique for each wafer, depending on the number and location of defects. This feature can help eliminate software piracy, since the software (which includes Configuration Data) for one wafer would not work on a second wafer.

According to the second embodiment of the device 10 of the present invention, a custom wafer is used rather than a wafer of XILINX FPGAs. This custom wafer will have many functional blocks that are essentially configurable FPGAs, but may also include special-purpose circuitry to optimize the device for a particular application. In this custom wafer application, different portions of the wafer could be directly interconnected using a polysilicon or metal layer on the wafer rather than using bonding wires. If all functional blocks on the entire wafer are interconnected, there must be some means for breaking the connection to non-functional blocks. A laser beam could easily etch around all the non-functional blocks, thereby breaking their connection to the functional portions of the wafer. Even with a custom wafer, the same wire bonding process used in the first embodiment may be used to interconnect the functional blocks on the custom wafer, allowing the bonding wires to bypass non-functional portions of the wafer.

Figure 4:
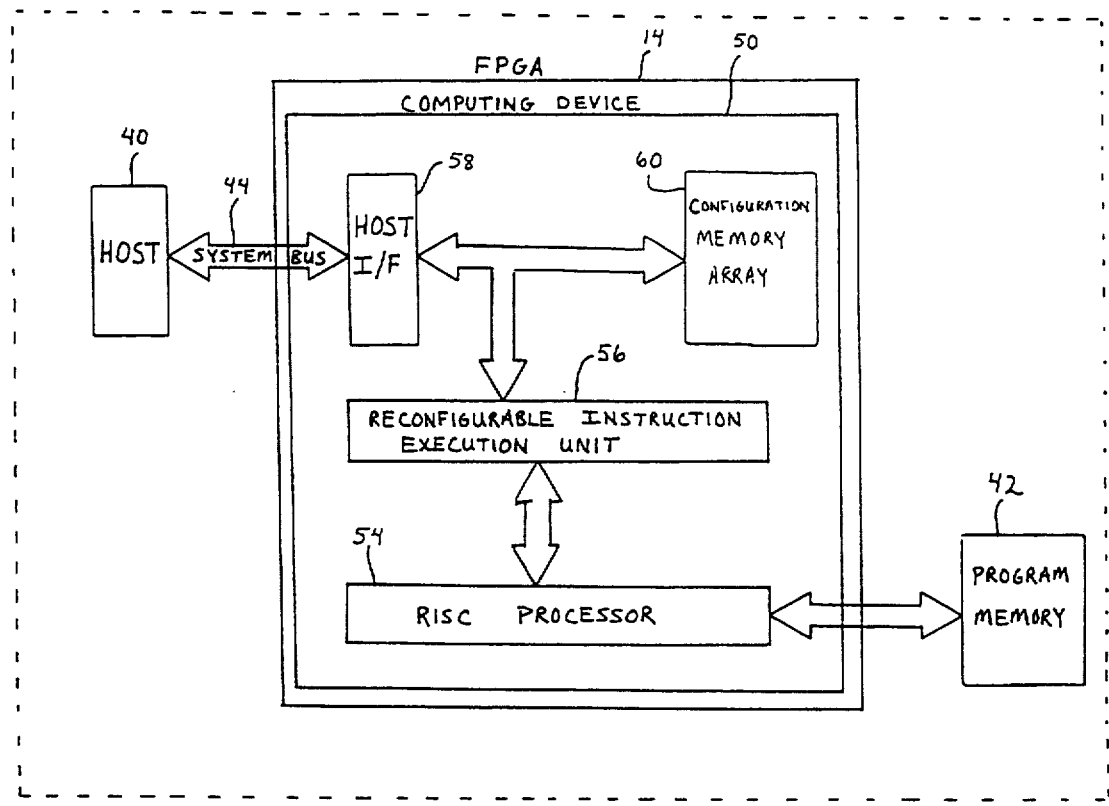
FIG. 4 is a block diagram of one of the many FPGAs of FIG. 1 when used as a computing device in a high-speed computer system.

According to the third embodiment of the present invention, one or more of the XILINX FPGAs in the first embodiment are programmed to be a Computing Device 50, as shown in FIG. 4. The Computing Device 50 is implemented within FPGA 14, and has a RISC Processor 54, which is coupled to a Reconfigurable Instruction Execution Unit 56, a Host Interface (I/F) 58, and a Configuration Memory Array 60. The Host Interface 58 is coupled to an external Host 40 via System Bus 44. The Host 40 controls the configuration of FPGA 14 by loading new Configuration Data through Host Interface 58 into the Configuration Memory Array 60 of FPGA 14 as required by the specific operation. RISC Processor 54 is coupled to Program Memory 42 which contains the code (instructions) for RISC Processor 54.

Many previous applications of FPGAs include very complex combinatorial circuits, or various sequencers or state machines. The most common use of the FPGA is to replace a large number of discrete integrated circuits by implementing these many functions in a single FPGA. But as the FPGA has increased in complexity and gate count, the complexity of the functions that could be implemented in the FPGA has also dramatically increased. With the Reduced Instruction Set Computer (RISC) architecture that requires so much less circuitry than the traditional Complex Instruction Set Computer (CISC) microprocessor, it is now possible to implement a small RISC processor within a portion of the XILINX FPGA 14. But the implementation of a RISC processor within an FPGA is not, in and of itself, greatly significant. Any person skilled in the microprocessor art could implement a RISC processor within an FPGA given the necessary level of complexity and functionality within the FPGA.

The Computing Device 50 within FPGA 14, however, is not a typical RISC processor. Included within FPGA 14 is a Reconfigurable Instruction Execution Unit 56. A typical RISC processor has a fixed instruction execution unit where all data manipulations are performed. The Reconfigurable Execution Unit 56 of the present invention allows the FPGA 14 to execute extremely complex instructions in a very short time, which greatly boosts the speed and performance of the Computing Device 50.

The operation of the Computing Device 50 is best understood by referring to FIG. 4. Once the FPGA 14 is powered up, it must be initially configured or programmed by the Host 40. The Host 40 thus writes the appropriate Configuration Data into the Configuration Memory Array 60, which programs the FPGA 14 to the appropriate initial state. The RISC processor 54 then begins executing its program from Program Memory 42. For illustrative purposes with the system shown in FIG. 4, it is assumed that the Host 40 is the "master" and the Computing Device 50 within FPGA 14 is a "slave" to Host 40. In this configuration the Host 40 is a computer capable of general-purpose functions. As the Host 40 executes its program, it may encounter a complex, time-consuming operation. When a complex operation is needed that would require a relatively long time to execute, and which can be implemented instead in hardware, Host 40 reconfigures the FPGA 14 for that particular operation by initiating the programming sequence for the FPGA 14 which causes new Configuration Data to be written into the Configuration Memory Array 60. Now referring to FIGS. 3 and 4, the effect of this new Configuration Data is to leave the programming of the I/O Blocks 32 unchanged, to leave the programming of the Logic Blocks 34 that comprise the RISC processor 54 unchanged, but to change the programming of the Logic Blocks 34 that comprise the Reconfigurable Instruction Execution Unit 56 such that the desired complex operation can be accomplished by the newly configured hardware on data that already exists within the Reconfigurable Instruction Execution Unit 56. Once the desired operation is complete, the FPGA 14 can signal the Host 40 and transfer the data to Host 40, if required.

This operation allows the Computing Device 50 within FPGA 14 to execute many different and complex operations in hardware rather than in long, time-consuming software routines. Since the Reconfigurable Instruction Execution Unit 56 within Computing Device 50 can be dynamically reconfigured to accomplish each of these complex operations in programmable hardware rather than employing fixed, special-purpose circuitry for each operation, the Computing Device 50 provides great flexibility and power with a minimum of circuitry.

Since the Computing Device 50 described above can be implemented in one XILINX FPGA, and the wafer 12 has many XILINX FPGAs, it is clear that multiple Computing Devices 50 may be implemented on a single wafer 12. These Computing Devices 50 are all controlled by a common Host 40 via a common System Bus 44, and each nominally have their own Program Memory 42. In this manner a single wafer can be programmed to provide a large number of Computing Devices 50 which can all operate in parallel, sharing tasks at the control of the Host 40. This allows for a waferscale Computing Device with fault-tolerance and performance that rivals and even surpasses some of the most powerful supercomputers known in the prior art.

It is an obvious modification that the Computing Device 50 of FIG. 4 could also be implemented on a custom wafer such as the custom wafer of the second embodiment rather than on a wafer of XILINX FPGAs. Other modifications of this embodiment are also obvious. For example, the RISC Processor 54 could be the "master" with the Host 40 being a "slave" which simply reconfigures FPGA 14 on command. In addition, the FPGA 14 need not necessarily be RAM-based if developments in other technologies such as EEPROMS make the use of other types of reconfigurable circuitry desirable. While the disclosure herein describes only the Reconfigurable Instruction Execution Unit 56 as changing during reconfiguration of the FPGA 14, it is an obvious extension of this invention that the attributes of the RISC Processor 54, the Host Interface 58, and other circuitry within the FPGA 14 could all be modified as needed during reconfiguration of the FPGA 14.

While the invention has been described in its preferred embodiment, it is to be understood that the words which have been used are words of description rather than limitation, and that changes may be made within the purview of the appended claims without departing from the true scope and spirit of the invention in its broader aspects. For example, while the discussion herein specifically refers to RAM-based, dynamically configurable gate arrays, it is obvious that gate arrays that are only configured once after fabrication (statically configurable, not dynamically configurable) could also be made fault-tolerant with the same approach taught herein.

What is claimed is:

1. A method for providing a fault-tolerant integrated circuit device including the steps of:

providing a wafer having a plurality of configurable gate arrays each having a plurality of programmable input/output (I/O) blocks, a plurality of programmable logic blocks, a plurality of programmable routing resources for interconnecting said plurality of programmable I/O blocks and said plurality of programmable logic blocks, and programming means for programming said plurality of programmable I/O blocks, said plurality of programmable logic blocks and said plurality of programmable routing resources, said programming means defining an appropriate mode of operation for each of said plurality of configurable gate arrays to achieve a desired mode of operation of said device;

testing each of said plurality of configurable gate arrays on said wafer;

generating a map of defects detected during said testing; and interconnecting said plurality of configurable gate arrays in a configuration which only connects to any of said plurality of configurable gate arrays that are functional and does not connect to any of said plurality of configurable gate arrays that are non-functional due to said map of defects;

providing a hardware description of said desired mode of operation of said device;

compiling said hardware description into a list of required resources which is a subset of available resources on said wafer, said available resources comprising said plurality of programmable I/O blocks, said plurality of programmable logic blocks and said plurality of programmable routing resources within said plurality of configurable gate arrays on said wafer; and partitioning said list of required resources among said plurality of configurable gate arrays on said wafer using said map of defects to achieve said desired mode of operation while only using any of said plurality of configurable gate arrays that are functional and without using any of said plurality of configurable gate arrays rendered non-functional due to said map of defects.

2. The method according to claim 1 further comprising the steps of:
   determining interconnects among said available resources in each of said plurality of configurable gate arrays using said map of defects to achieve said desired mode of operation while only using any of said available resources within said plurality of configurable gate arrays that are functional and without using any of said available resources within said plurality of configurable gate arrays rendered non-functional due to said map of defects; and
   generating configuration data for each of said plurality of configurable gate arrays corresponding to said partitioning and said interconnects.

3. The method according to claim 2 further comprising the step of:
   loading said configuration data corresponding to each of said plurality of configurable gate arrays into said programming means of each of said plurality of configurable gate arrays on said wafer.

4. The method according to claim 2 further comprising the steps of:
   providing a microprocessor implemented within at least one of said plurality of configurable gate arrays by programming said programming means;
   implementing reconfigurable instruction execution means within said at least one of said plurality of configurable gate arrays by programming said programming means, said reconfigurable instruction execution means being coupled to said microprocessor for performing manipulation and computation of data contained within said plurality of programmable logic blocks of said at least one of said plurality of configurable gate arrays; and
   reconfiguring said reconfigurable instruction execution means by programming said programming means to change said reconfigurable instruction execution means so an operation on said configuration data is carried out by circuits within said at least one of said plurality of configurable gate arrays after said reconfiguring is complete.

5. The method according to claim 1 further comprising the step of:
   providing a functional description of said desired mode of operation in the form of equations and formulae; and
   generating said hardware description from said functional description.

6. The method according to claim 1 further comprising the step of:
   providing a functional description of said desired mode of operation in the form of a list of computer instructions comprising computer code; and
   generating said hardware description from said functional description.

7. A method for providing a fault-tolerant integrated circuit device including the steps of:
   providing a wafer having a plurality of configurable gate arrays each having a plurality of input/output (I/O) pads, a plurality of programmable I/O blocks, a plurality of programable logic blocks, a plurality of programmable routing resources for interconnecting said plurality of I/O pads, said plurality of programable I/O blocks and said plurality of programmable logic blocks, and programming means for programming said plurality of programable I/O blocks, said plurality of programmable logic blocks and said plurality of programmable routing resources, said programming means defining an appropriate mode of operation for each of said plurality of configurable gate arrays on said wafer to achieve a desired mode of operation of said device;
   testing each of said plurality of configurable gate arrays on said wafer
   generating a map of defects detected during said testing;
   interconnecting said plurality of programmable I/O pads on said plurality of configurable gate arrays in a configuration which only connects to any of said plurality of configurable gate arrays that are functional and does not connect to any of said plurality of configurable gate arrays that are non-functional due to said map of defects;
   providing a functional description of said desired mode of operation in the form of equations and formulae;
   generating a hardware description of said desired mode of operation of said device from said functional description;
   compiling said hardware description into a list of required resources which is a subset of available resources on said wafer, said available resources comprising said plurality of programmable I/O blocks, said plurality of programmable logic blocks and said plurality of programmable routing resources within said plurality of configurable gate arrays;
   partitioning said list of required resources among said plurality of configurable gate arrays on said wafer using said map of defects to achieve said desired mode of operation without using any of said plurality of configurable gate arrays rendered non-functional due to said map of defects;
   determining interconnects among said available resources in each of said plurality of configurable gate arrays using said map of defects to achieve said desired mode of operation without using any of said available resources within said plurality of configurable gate arrays rendered non-functional due to said map of defects;
   generating configuration data for each of said plurality of configurable gate arrays corresponding to said partitioning and said interconnects; and
   loading said configuration data corresponding to each of said plurality of configurable gate arrays into said programming means of each of said plurality of configurable gate arrays on said wafer.

8. The method according to claim 7 further comprising the steps of:
   providing a microprocessor implemented within at least one of said plurality of configurable gate arrays by programming said programming means;
   implementing reconfigurable instruction execution means within said at least one of said plurality of configurable gate arrays by programming said programming means, said reconfigurable instruction execution means being coupled to said microprocessor for performing manipulation and computation of data contained within said plurality of programmable logic blocks of said at least one of said plurality of configurable gate arrays; and reconfiguring said reconfigurable instruction execution means by programing said programming means to change said reconfigurable instruction execution means so an operation on said configuration data is carried out by circuits within said at least one of said plurality of configurable gate arrays after said reconfiguring is complete.

9. A fault-tolerant integrated circuit device comprising:

gate array means for obtaining a desired mode of operation of said device, said gate array means further comprising a wafer having a plurality of configurable gate arrays each having a plurality of programmable input/output (I/O) blocks, a plurality of programmable logic blocks, a plurality of programmable routing resources for interconnecting said plurality of programmable I/O blocks and said plurality of programable logic blocks, and programming means for programming said plurality of programmable I/O blocks, said plurality of programmable logic blocks and said plurality of programable routing resources, said programing means defining an appropriate mode of operation for each of said plurality of configurable gate arrays to achieve said desired mode of operation of said device;

defect map means incorporated in said gate array means for generating a map of defects detected during testing of each of said plurality of configurable gate arrays on said wafer; and interconnect means incorporated in said gate array means for interconnecting said plurality of configurable gate arrays in a configuration which only connects to any of said plurality of configurable gate arrays that are functional and does not connect to any of said plurality of configurable gate arrays that are non-functional due to said map of defects;

description means incorporated in said gate array means for providing a hardware description of said desired mode of operation of said device;

compiling means incorporated in said gate array means for compiling said hardware description into a list of required resources which is a subset of available resources on said wafer, said available resources comprising said plurality of programmable I/O blocks, said plurality of programmable logic blocks and said plurality of programmable routing resources within said plurality of configurable gate arrays on said wafer; and partitioning means incorporated in said gate array means for partitioning said list of required resources among said plurality of configurable gate arrays on said wafer using said map of defects to achieve said desired mode of operation while only using any of said plurality of configurable gate arrays that are functional and without using any of said plurality of configurable gate arrays rendered non-functional due to said map of defects.

10. The fault-tolerant integrated circuit device according to claim 9 further comprising:

determination means incorporated in said gate array means for determining interconnects among said available resources in each of said plurality of configurable gate arrays using said map of defects to achieve said desired mode of operation while only using any of said available resources within said plurality of configurable gate arrays that are functional and without using any of said available resources within said plurality of configurable gate arrays rendered non-functional due to said map of defects; and generation means incorporated in said gate array means for generating configuration data for each of said plurality of configurable gate arrays corresponding to said partitioning and said interconnects.

11. The fault-tolerant integrated circuit device according to claim 10 further comprising:

load means incorporated in said gate array means for loading said configuration data corresponding to each of said plurality of configurable gate arrays into said programming means of each of each of said plurality of configurable gate arrays on said wafer.

12. The fault-tolerant integrated circuit device according to claim 11 further comprising:

microprocessor means incorporated in said gate array means for providing a microprocessor implemented within at least one of said plurality of configurable gate arrays by programming said programming means;

execution means incorporated in said gate array means for implementing reconfigurable instruction execution means within said at least one of said plurality of configurable gate arrays by programming said programming means, said reconfigurable instruction execution means being coupled to said microprocessor for performing manipulation and computation of data contained within said plurality of programmable logic blocks of said at least one of said plurality of configurable gate arrays; and reconfiguration means incorporated in said gate array means for reconfiguring said reconfigurable instruction execution means to change said reconfigurable instruction execution means so an operation on said configuration data is carried out by circuits within said at least one of said plurality of configurable gate arrays after said reconfiguring is complete, 13. The fault-tolerant integrated circuit device according to claim 9 further comprising:

first functional description means incorporated in said gate array means for providing a functional description of said desired mode of operation in the form of equations and formulae; and first generation means incorporated in said gate array means for generating said hardware description from said functional description.

14. The fault-tolerant integrated circuit device according to claim 9 further comprising:

second functional description means incorporated in said gate array means for providing a functional description of said desired mode of operation in the form of a list of computer instructions comprising computer code; and second generation means incorporated in said gate array means for generating said hardware description from said functional description.

15. A fault-tolerant integrated circuit device comprising:

gate array means for obtaining a desired mode of operation of said device, said gate array means further comprising a wafer having a plurality of configurable gate arrays each having a plurality of input/output (I/O) pads, a plurality of programmable I/O blocks, a plurality of programmable logic blocks, a plurality of programmable routing resources for interconnecting said plurality of I/O pads, said plurality of programmable I/O blocks and said plurality of programmable logic blocks, and programming means for programming said plurality of programmable I/O blocks, said plurality of programmable logic blocks and said plurality of programmable routing resources, said programming means defining an appropriate mode of operation for each of said plurality of configurable gate arrays on said wafer to achieve said desired mode of operation of said device;

defect map means incorporated in said gate array means for generating a map of defects detected during testing of each of said plurality of configurable gate arrays on said wafer;

interconnect means incorporated in said gate array means for interconnecting said plurality of I/O pads on said plurality of configurable gate arrays in a configuration which only connects to any of said plurality of configurable gate arrays that are functional and does not connect to any of said plurality of configurable gate arrays that are non-functional due to said map of defects;

functional description means incorporated in said gate array means for providing a functional description of said desired mode of operation in the form of equations and formulae;

hardware description means incorporated in said gate array means for generating a hardware description of said desired mode of operation of said device from said functional description;

compiling means incorporated in said gate array means for compiling said hardware description into a list of required resources which is a subset of available resources on said wafer, said available resources comprising said plurality of programmable I/O blocks, said plurality of programmable logic blocks and said plurality of programmable routing resources within said plurality of configurable gate arrays;

partitioning means incorporated in said gate array means for partitioning said list of required resources among said plurality of configurable gate arrays on said wafer using said map of defects to achieve said desired mode of operation without using any of said plurality of configurable gate arrays rendered non-functional due to said map of defects;

determination means incorporated in said gate array means for determining interconnects among said available resources in each of said plurality of configurable gate arrays using said map of defects to achieve said desired mode of operation without using any of said plurality of configurable gate arrays rendered non-functional due to said map of defects;

generating means incorporated in said gate array means for generating configuration data for each of said plurality of configurable gate arrays corresponding to said partitioning and said interconnects; and loading means incorporated in said gate array means for loading said configuration data corresponding to each of said plurality of configurable gate arrays into said programming means of each of said plurality of configurable gate arrays on said wafer.

16. The fault-tolerant integrated circuit device according to claim 15 further con, rising:

microprocessor means incorporated in said gate array means for providing a microprocessor implemented within at least one of said plurality of configurable gate arrays by programming said programming means;

execution means incorporated in said gate array means for implementing reconfigurable instruction execution means within said at least one of said plurality of configurable gate arrays by programing said programing means, said reconfigurable instruction execution means being coupled to said microprocessor for performing manipulation and computation of data contained within said plurality of programmable logic blocks of said at least one of said plurality of configurable gate arrays; and reconfiguration means incorporated in said gate array means for reconfiguring said reconfigurable instruction execution means by programming said programing means to change said reconfigurable instruction execution means so an operation on said configuration data is carried out by circuits within said at least one of said plurality of configurable gate arrays after said reconfiguring is complete.

* * * * *